United States Patent
Chua et al.

(10) Patent No.: US 6,412,680 B1
(45) Date of Patent: Jul. 2, 2002

(54) DUAL-IN-LINE BGA BALL MOUNTER

(75) Inventors: Kok Hua Chua; Suharto Leo; Hak Meng Tan; Yew Chung Wong, all of Singapore (SG)

(73) Assignee: Agere Systems Guardian Corp., Orlando, FL (US)

(*) Notice: Subject to any disclaimer, the term of this patent is extended or adjusted under 35 U.S.C. 154(b) by 0 days.

(21) Appl. No.: 09/669,278

(22) Filed: Sep. 26, 2000

(51) Int. Cl.[7] .................................................. B23K 1/00
(52) U.S. Cl. ............................ 228/6.2; 228/9; 228/33; 228/47.1
(58) Field of Search .......................... 228/6.2, 4.1, 6.1, 228/8, 9, 33, 47.1; 438/613; 257/737, 738

(56) References Cited

U.S. PATENT DOCUMENTS

| | | | |
|---|---|---|---|
| 5,626,277 A | * 5/1997 | Kawada | 228/246 |
| 5,872,051 A | * 2/1999 | Fallon et al. | 228/180.22 |
| 5,899,737 A | * 5/1999 | Trabucco | 257/738 |
| 5,984,166 A | * 11/1999 | Holzmann | 118/504 |
| 5,989,471 A | * 11/1999 | Lian et al. | 100/258 R |
| 6,103,549 A | * 8/2000 | Master et al. | 438/106 |
| 6,186,392 B1 | * 2/2001 | Ball | 228/180.22 |
| 6,283,358 B1 | * 9/2001 | Ball | 228/180.21 |
| 6,284,996 B1 | * 9/2001 | Kim et al. | 219/85.13 |

FOREIGN PATENT DOCUMENTS

WO    WO 99/17595    * 4/1999

* cited by examiner

Primary Examiner—Tom Dunn
Assistant Examiner—Colleen P. Cooke
(74) Attorney, Agent, or Firm—Steve Mendelsohn

(57) ABSTRACT

A BGA ball mount line with a dual in-line mounter flowing into one reflow oven and one in-line cleaner. The dual in-line mounter comprises a first ball mount cell and a second ball mount cell. The second ball mount cell is parallel to and a mirror image of the first ball mount cell. The first ball mount cell and the second ball mount cell can be run by a single operator located between them. In one embodiment of the invention, the BGA ball mount line with dual in-line mounters is implemented in three phases to provide a smooth transition. In the first phase, a proto-line is set-up with a first ball mount cell, a loading cell, a diverter cell, and an unloading cell, to optimize the first ball mount cell. In the second phase, a reflow oven and a flux cleaner are added to form a production line. In the third phase, a second ball mount cell is added to form a BGA ball mount line with a dual in-line mounter.

11 Claims, 4 Drawing Sheets

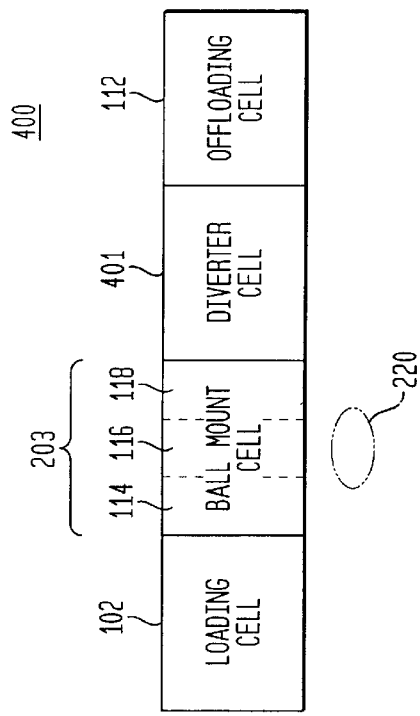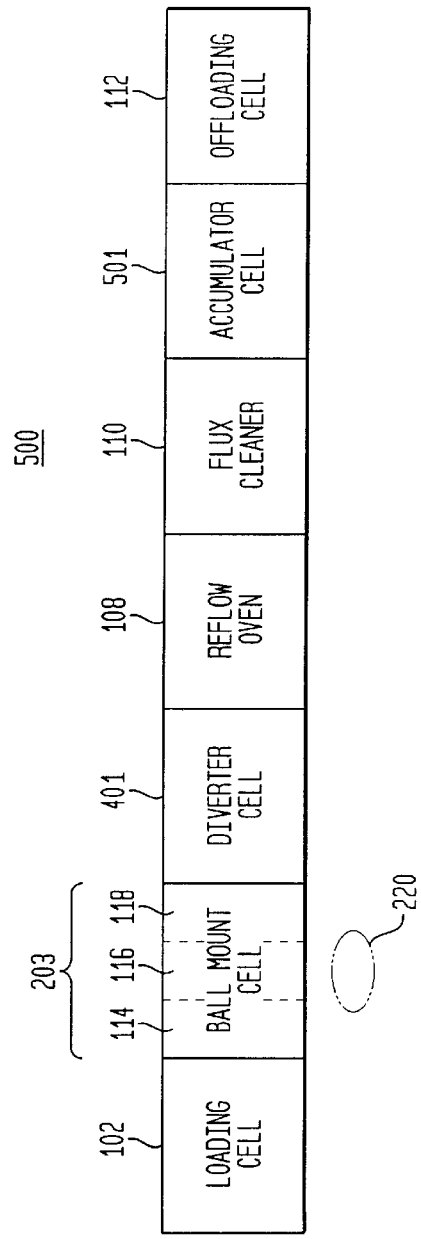

DUAL-IN-LINE BGA BALL MOUNTER

BACKGROUND OF THE INVENTION

1. Field of the Invention

The present invention relates to semiconductor manufacturing, and, in particular, to a technique for implementing a ball grid array (BGA) fabrication line.

2. Description of the Related Art

Due to the popularity of surface mount technology, the demand for semiconductor devices in ball grid array (BGA) packages is increasing. However, the ball mounting process (e.g., mounting solder balls to the bottom of a BGA package which are reflowed to form contacts with solder pads on a board or flex circuit) is very expensive. As shown in FIG. 1, a conventional BGA ball mount line 100 comprises a ball mount cell 104, a reflow oven 108, and a flux cleaner 110. Ball mount line 100 further comprises a loading cell 102 at its beginning, an offloading cell 112 at its end, and transfer cells 106 between ball mount cell 104 and reflow oven 108 and between flux cleaner 110 and offloading cell 112. Ball mount cell 104 typically comprises a fluxer 114 that applies flux to a BGA package, a sphere mounter 116 that applies solder balls (spheres) to the BGA package under heat and pressure, and a post mount inspection station 118 that inspects the solder balls for proper mounting. Typical ball mount cells, such as ball mount cell 104, are configured to be operated from only one side of the BGA ball mount line (e.g., with an operator positioned at location 120 in FIG. 1).

A conventional BGA ball mount line is long (e.g., about 11.5 meters), requiring substantial floor space, consuming substantial quantities of power and water, and requiring a significant capital investment. Additionally, a conventional BGA ball mount line requires a dedicated operator to operate the ball mount cell.

SUMMARY OF THE INVENTION

The present invention provides a method for mounting solder balls on a ball grid array which improves the utilization of labor, water, and electrical power while reducing capital investment. According to the present invention, a BGA ball mount line is configured with a dual in-line ball mounter comprising two parallel ball mount cells. The two ball mount cells of the dual in-line ball mounter feed devices to a single reflow oven and a single flux cleaner to form a more efficient BGA ball mount line.

In one embodiment, the present invention is a BGA ball mount line, comprising (a) first and second loading cells; (b) a dual in-line ball mounter comprising first and second ball mount cells, wherein the first loading cell is configured to transfer a first stream of BGA devices to the first ball mount cell; the second loading cell is configured to transfer a second stream of BGA devices to the second ball mount cell; and the first and second ball mount cells are configured to operate concurrently to mount solder balls onto the first and second streams of BGA devices; (c) a first transfer cell configured to receive the first and second streams of BGA devices from both the first and second ball mount cells of the dual in-line ball mounter; (d) a reflow oven configured to receive the first and second streams of BGA devices from the first transfer cell and perform a single reflow process concurrently on both the first and second streams of BGA devices; (e) a flux cleaner configured to receive the first and second streams of BGA devices from the reflow oven and clean flux concurrently from both the first and second streams of BGA devices; (f) a second transfer cell configured to receive the first and second streams of BGA devices from the flux cleaner; and (g) first and second offloading cells, wherein the first offloading cell is configured to receive the first stream of BGA devices from the second transfer cell; and the second offloading cell is configured to receive the second stream of BGA devices from the second transfer cell.

BRIEF DESCRIPTION OF THE DRAWINGS

Other aspects, features, and advantages of the present invention will become more fully apparent from the following detailed description, the appended claims, and the accompanying drawings in which:

FIGS. 4 and 5 show representative layouts of first and second sequential phases of a phased implementation of a dual in-line BGA ball mount line in which the block diagram of FIG. 2 shows the third and final phase, according to one embodiment of the present invention.

DETAILED DESCRIPTION

Figure 1:
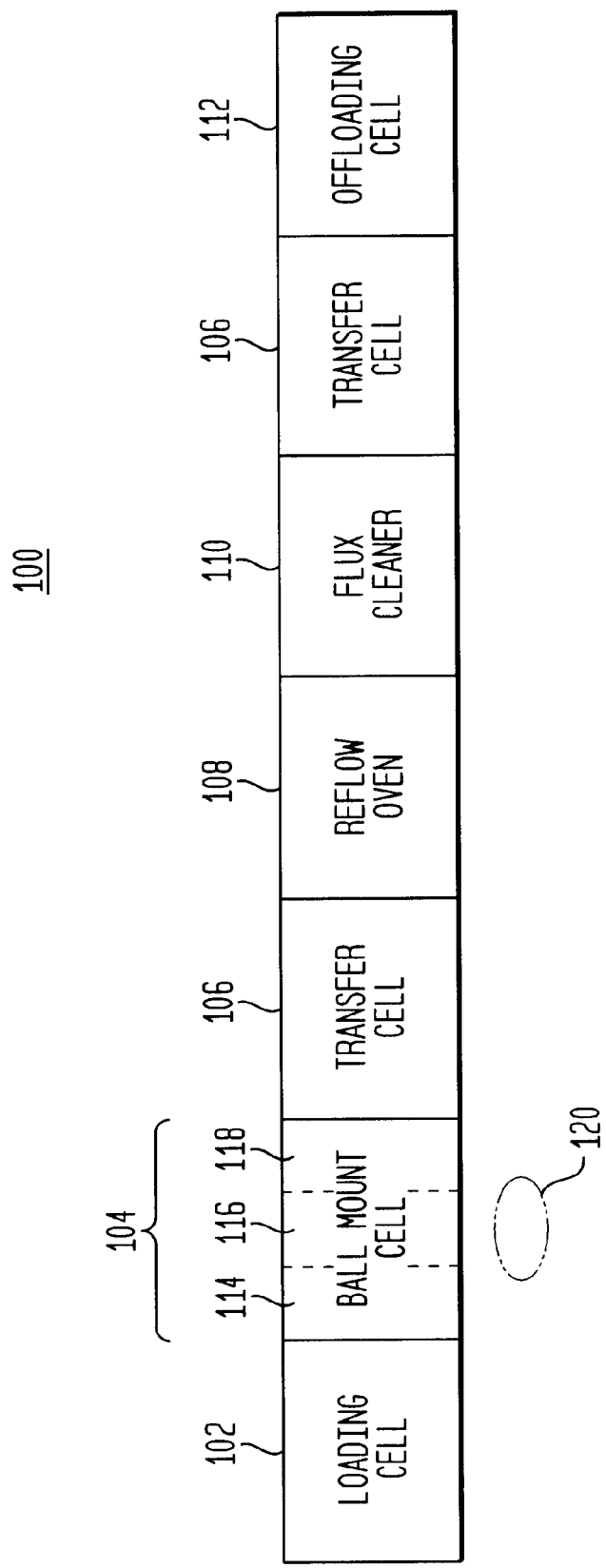
FIG. 1 shows a representative layout of a BGA ball mount line according to the prior art.

One problem with conventional BGA ball mount lines, such as ball mount line 100 of FIG. 1, is that the throughput of a typical ball mount cell, such as ball mount cell 104 of FIG. 1, is not sufficient to fully utilize the capacities of a typical reflow oven, a typical flux cleaner, or a typical operator. As a result, reflow oven 108 of FIG. 1 can either be operated at less than its full capacity of BGA devices or it can be turned off until enough BGA devices are processed by ball mount cell 104. Either way, reflow oven 108 will consume more electrical power per BGA device than it would if it were fully utilized. Similarly, if flux cleaner 110 of FIG. 1 is operated at less than its full capacity, it will consume more water per BGA device than it would if it were fully utilized. Since it is difficult to match the throughput in all cells of a conventional BGA ball mount line, buffers are typically provided before the reflow oven and flux cleaner to accumulate devices, which only adds to the floor space requirement.

Figure 2:
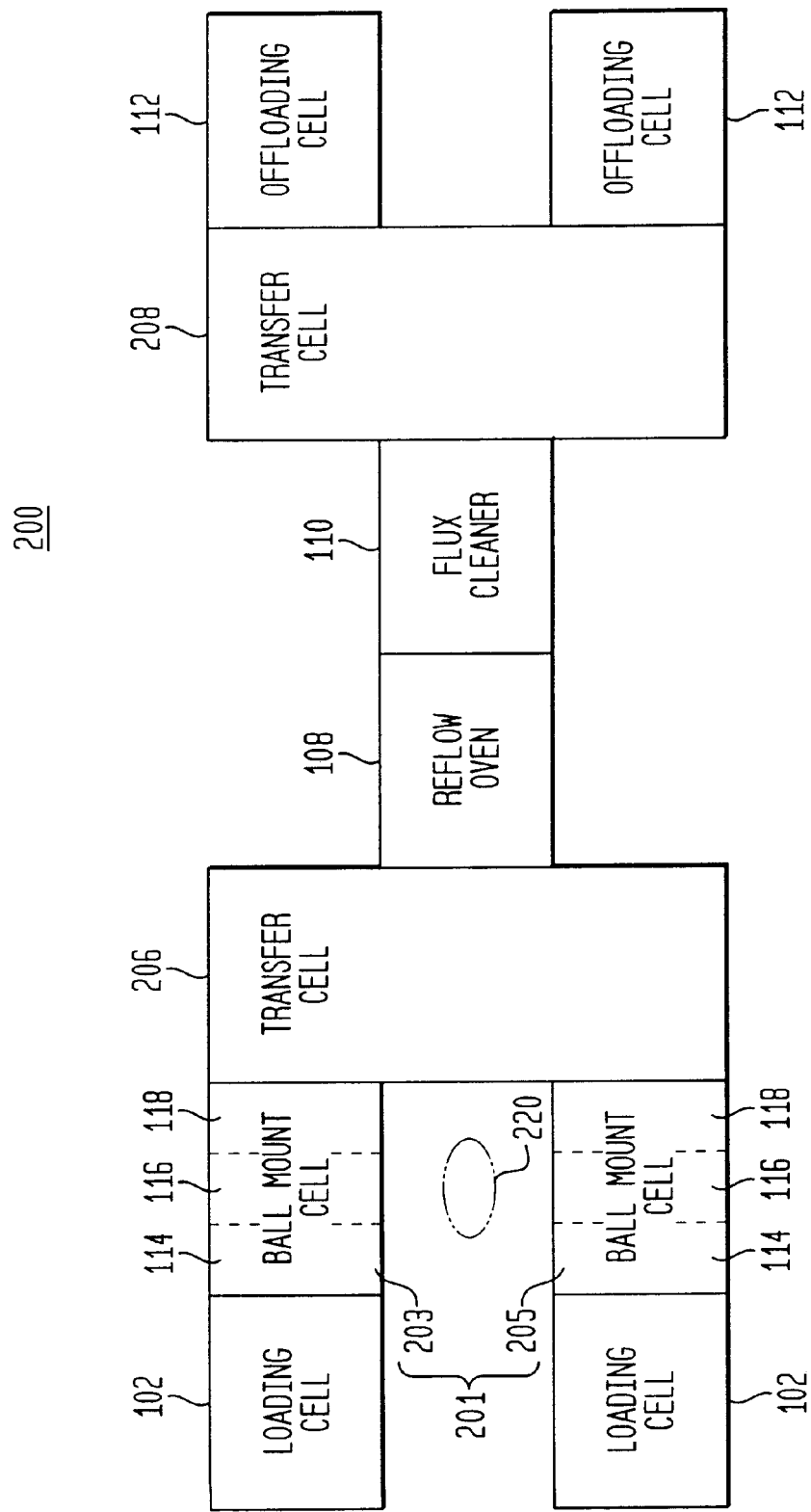
FIG. 2 shows a representative layout of a dual in-line BGA ball mount line according to one embodiment of the present invention.

As shown in FIG. 2, to more fully utilize the capacities of reflow oven 108, flux cleaner 110, and the operator, BGA ball mount line 200 of the present invention replaces the single ball mount cell of the prior art with a dual in-line ball mounter 201. Dual in-line ball mounter 201 comprises two ball mount cells configured to operate in parallel: a first ball mount cell 203 flowing left-to-right relative to an operator at location 220 and a second ball mount cell 205, parallel to first ball mount cell 203, flowing right-to-left relative to an operator at location 220. Each ball mount cell 203, 205 of dual in-line ball mounter 201 comprises a fluxer 114, a sphere mounter 116, and a post mount inspection (PMI) station 118. Note, however, that second ball mount cell 205 is a mirror image of first ball mount cell 203, such that a single operator positioned at location 220 can run both ball mount cells 203 and 205 simultaneously, thereby increasing labor efficiency.

On one preferred implementation, loading cells 102, transfer cells 206 and 208, and offloading cells 112 are all from Motorola Manufacturing Systems-Asia of Singapore;

ball mount cells 203 and 205 is a Sphere Attach System Model No. MSA-250-A Plus from Motorola Manufacturing Systems-Asia; reflow oven 108 is a Solder Reflow Furnace Model No. VIP-70N from BTU International of North Billerica, Massachusetts; and flux cleaner 110 is a Compact Mini-Washer Model No. CMW8018 from Ultra Clean Technology of Singapore.

As shown in FIG. 2, each ball mount cell 203, 205 is loaded from a different loading cell 102, and both ball mount cells 203, 205 in dual in-line ball mounter 201 feed into a double-wide transfer cell 206, which transfers BGA devices from both ball mount cells 203, 205 into particular lanes of reflow oven 108. The number of lanes is dependent upon the design of the reflow oven. For example, a Paragon 70N by BTU International of North Billerica, Massachusetts, can be configured for up to six lanes of BGA devices. A single Paragon 70N reflow oven can accommodate all of the BGA devices from two ball mount cells. For example, each ball mount cell can process 200-mm BGA devices at a rate of one device every 10 seconds. The Paragon 70N reflow oven has a maximum belt speed of 32 inches/minute (13.55 mm/second), which would accommodate a 200-mm BGA in each lane every 20 seconds with a 71-mm gap. Therefore, the capacity of two ball mounters can be accommodated with four lanes in a Paragon 70N reflow oven. It should be noted that reflow oven 108 can be any of a number of commercially available reflow ovens, providing it has sufficient power to maintain the reflow profile for the increased throughput of BGA devices.

As shown in FIG. 2, BGA devices are transferred from reflow oven 108 directly to flux cleaner 110. When flux cleaner 110 is implemented with a Compact Mini-Washer Model No. CMW8018 from Ultra Clean Technology, flux cleaner 110 is capable of handling 6 lanes of BGA devices at a speed of 27 inches/minute (e.g., about 11.4 mm/second). Flux cleaner 110 feeds into a second double-wide transfer cell 208, from which the BGA devices are manually offloaded at two offloading cells 112.

The process flow of the present invention provides several advantages beyond better utilization of operator labor, electrical power, and water. The line capacity can be doubled by using a dual in-line mounter without adding any extra reflow ovens, flux cleaners, or transfer cells, saving both capital and floor space. Also, because the throughput of the dual in-line mounter can be matched to the reflow oven and flux cleaner, no buffers are required to account for throughput disparity.

In one application of the present invention, each ball mount cell 203, 205 of dual in-line ball mounter 201 can be used to process a different BGA device. For example, first ball mount cell 203 could be used to mount solder balls on a plastic ball grid array (PBGA) device, while second ball mount cell 205 concurrently mounts solder balls on a fully-molded and separable ball grid array (FSBGA) device. Concurrent processing of different types of BGA devices requires that both devices use the same reflow profile (i.e., the heating profile in reflow oven 108). This is possible since both PBGA and FSBGA devices can be reflowed with a single reflow profile.

Figure 3:
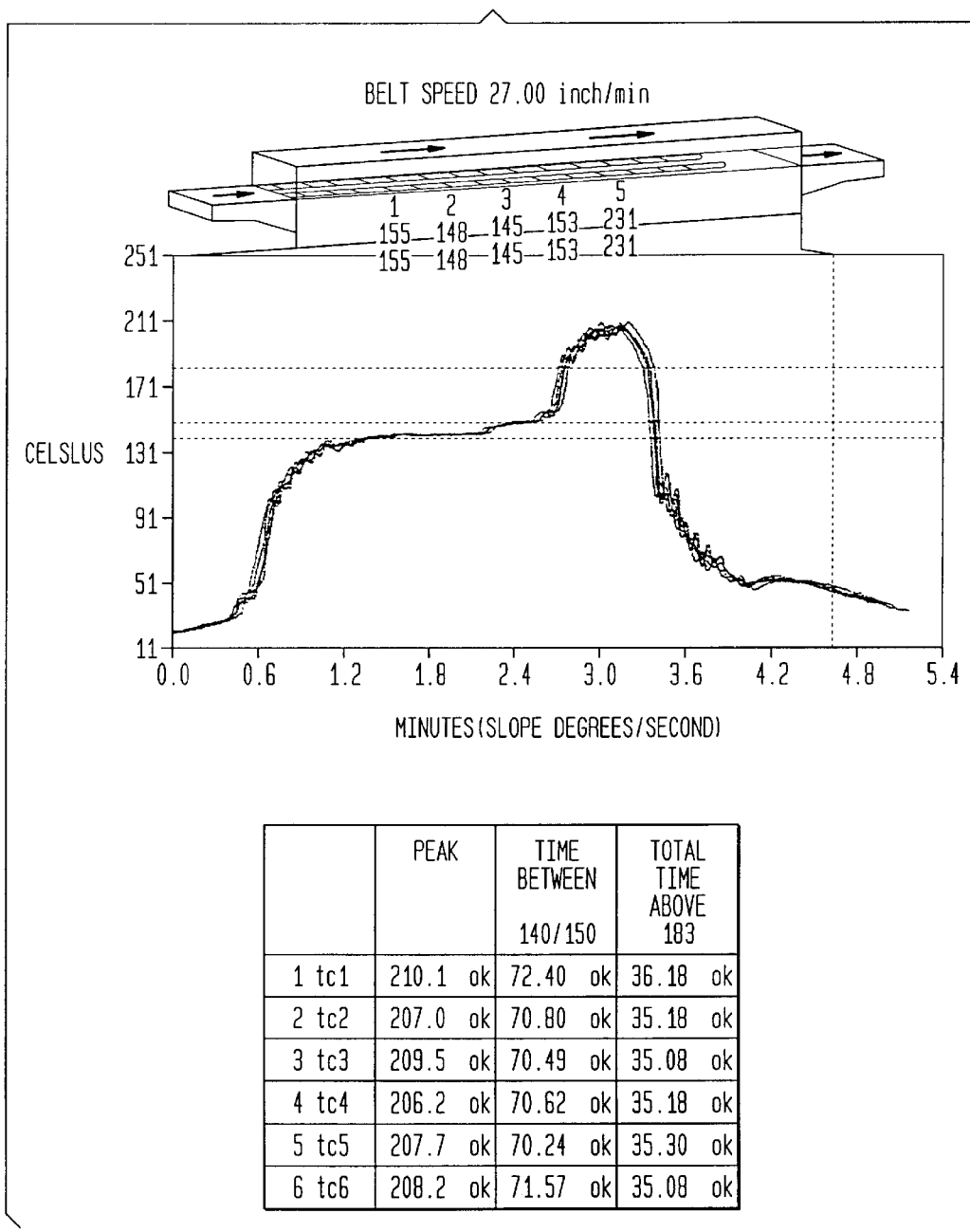
FIG. 3 shows a reflow profile that is suitable for both PBGA and FSBGA devices.

FIG. 3 shows a reflow profile that is suitable for both PBGA and FSBGA devices. This reflow profile comprises a first segment of about 70 to 72 seconds between about 140 C and 150 C followed by a second segment of about 35 to 36 seconds at temperatures above about 183 C with a peak temperature between about 206 C and 210 C. It should be noted that, in a typical BGA ball mount line, the operator sets a reflow profile for the particular BGA device being manufactured. Running a single reflow profile reduces the risk of defects caused by running the wrong profile for the specific BGA device being manufactured.

Optionally, the lane allocation of reflow oven 108 can be programmed for flexible utilization of the lanes in the reflow oven. Flexible allocation would be beneficial, for example, when different length BGA devices are run concurrently.

Another optional feature of the present invention is a magazine/substrate recognition capability. Magazine/substrate recognition capability means that each magazine will only accept the correct BGA device (i.e., substrate). Magazine/substrate recognition can be achieved, for example, by a ball pattern inspection camera/device that is able to identify the correct ball count device. This feature would be especially useful if ball mount cells 203 and 205 process BGA devices of the same substrate layout and package dimension, but of different ball count.

BGA ball mount line 200 of FIG. 2 can be implemented in three phases compatible with continuous fabrication. In the first phase shown in FIG. 4, a BGA ball mounter proto-line 400 is set-up. In this phase, first ball mount cell 203 is incorporated into a magazine-to-magazine flow without reflow or flux cleaning. A loading cell 102 is used to load BGA devices into first ball mount cell 203, which fluxes the BGA devices (114), mounts the solder balls (116), and performs post-mount inspection (118). The BGA devices then feed from first mount cell 203 into a diverter cell 401, which is designed to be detachable during subsequent phases of the implementation. In diverter cell 401, accepted BGA devices are forwarded to an offloading cell 112, while defective BGA devices are returned to loading cell 102. The proto-line phase allows for optimization of the mounting step of the BGA ball mount process before placing it in a production line with the reflow and flux cleaning steps.

The second phase shown in FIG. 5 is a BGA ball mount line 500 with only a single ball mount cell. In this phase, loading cell 102, first ball mount cell 203, and diverter cell 401 from proto-line 400 are re-used. A reflow oven 108 is connected to diverter cell 401 such that it can be detached during the subsequent phase of the implementation. A flux cleaner 110 is attached to reflow oven 108. An accumulator cell 501 is attached to flux cleaner 110 such that it can be detached during the subsequent phase of the implementation. Offloading cell 112 is attached to accumulator cell 501 such that it can be detached during the subsequent phase of the implementation. The second implementation phase provides production capability for PBGA or FSBGA devices.

In the third phase of the implementation shown in FIG. 2, a second loading cell 102, a second ball mount cell 205, and a second offloading cell 112 are added, and diverter cell 401 and accumulator cell 501 are replaced with a first double-wide transfer cell 206 and a second double wide transfer cell 208.

It will be further understood that various changes in the details, materials, and arrangements of the parts which have been described and illustrated in order to explain the nature of this invention may be made by those skilled in the art without departing from the scope of the invention as expressed in the following claims. For example, while 200-mm BGA devices are described, other size BGA devices could be used. Also, embodiments of the present invention are possible using BGA devices other than PBGA and FSBGA devices.

What is claimed is:

1. A BGA ball mount line, comprising:

(a) first and second loading cells;

(b) a dual in-line ball mounter comprising first and second ball mount cells, wherein:
- the first loading cell is configured to transfer a first stream of BGA devices to the first ball mount cell;
- the second loading cell is configured to transfer a second stream of BGA devices to the second ball mount cell; and
- the first and second ball mount cells are configured to operate concurrently to mount solder balls onto the first and second streams of BGA devices;

(c) a first transfer cell configured to receive the first and second streams of BGA devices from both the first and second ball mount cells of the dual in-line ball mounter;

(d) a reflow oven configured to receive the first and second streams of BGA devices from the first transfer cell and perform a single reflow process concurrently on both the first and second streams of BGA devices;

(e) a flux cleaner configured to receive the first and second streams of BGA devices from the reflow oven and clean flux concurrently from both the first and second streams of BGA devices;

(f) a second transfer cell configured to receive the first and second streams of BGA devices from the flux cleaner; and (g) first and second offloading cells, wherein:
- the first offloading cell is configured to receive the first stream of BGA devices from the second transfer cell; and
- the second offloading cell is configured to receive the second stream of BGA devices from the second transfer cell.

2. The invention of claim 1, wherein the BGA ball mount line is configured without any buffers.

3. The invention of claim 1, wherein the BGA ball mount line is configured with only one reflow oven and only one flux cleaner.

4. The invention of claim 1, wherein the second ball mount cell is a mirror image of the first ball mount cell, thereby enabling both the first and second ball mount cells to be operated concurrently by a single operator.

5. The invention of claim 1, wherein the reflow oven is configured to apply the single reflow process concurrently to two or more different types of BGA devices.

6. The invention of claim 5, wherein the first ball mount cell is configured to mount solder balls onto a first type of BGA device and the second ball mount cell is configured to mount solder balls onto a second type of BGA device different from the first type.

7. The invention of claim 5, wherein the reflow oven is configured with device recognition that enables restriction of the types of BGA device that can be placed within each lane of the reflow oven.

8. The invention of claim 7, wherein two different lanes of the reflow oven are configured with different device recognition for two different types of BGA devices.

9. The invention of claim 5, wherein the single reflow process comprises a first segment of about 70 to 72 seconds between about 140 C and 150 C followed by a second segment of about 35 to 36 seconds at temperatures above about 183 C with a peak temperature between about 206 C and 210 C.

10. The invention of claim 1, wherein the BGA ball mount line corresponds to a third phase of a three-phase implementation having previous first and second implementation phases, wherein:

the first implementation phase comprises:
(1) the first loading cell;
(2) the first ball mount cell configured to the first loading cell;
(3) a diverter cell configured to the first ball mount cell; and
(4) the first offloading cell configured to the diverter cell; and the second implementation phase comprises:
(1) the first loading cell;
(2) the first ball mount cell configured to the first loading cell;
(3) the diverter cell configured to the first ball mount cell;
(4) the reflow oven configured to the diverter cell;
(5) the flux cleaner configured to the reflow oven,
(6) an accumulator cell configured to the flux cleaner; and
(7) the first offloading cell configured to the accumulator cell.

11. The invention of claim 10, wherein the second implementation phase is reconfigured into the third implementation phase by:
(i) adding the second loading cell and the second ball mount cell of the dual in-line ball mounter;
(ii) replacing the diverter cell with the first transfer cell;
(iii) replacing the accumulator cell with the second transfer cell; and
(iv) adding the second offloading cell.

* * * * *